United States Patent [19]
Landers et al.

[11] Patent Number: 5,676,587
[45] Date of Patent: Oct. 14, 1997

[54] SELECTIVE POLISH PROCESS FOR TITANIUM, TITANIUM NITRIDE, TANTALUM AND TANTALUM NITRIDE

[75] Inventors: William Francis Landers, Beacon, N.Y.; Matthew Jeremy Rutten, Milton, Vt.; Thomas Robert Fisher, Jr., Beacon, N.Y.; Dean Allen Schaffer, South Burlington, Vt.

[73] Assignee: International Business Machines Corporation, Armonk, N.Y.

[21] Appl. No.: 568,162

[22] Filed: Dec. 6, 1995

[51] Int. Cl.$^6$ .................................................. B24B 1/00
[52] U.S. Cl. .................... 451/57; 451/59; 451/37; 451/41; 156/636.1
[58] Field of Search ............................. 451/57, 59, 53, 451/28, 29, 285–289, 41, 37; 216/89, 88; 156/636.1

[56] References Cited

U.S. PATENT DOCUMENTS

| | | | |
|---|---|---|---|
| 3,429,080 | 2/1969 | Lachapelle | 51/309 |
| 3,662,500 | 5/1972 | Mendel | 451/37 |
| 3,750,341 | 8/1973 | Matthews, Jr. et al. | 451/78 |
| 4,481,741 | 11/1984 | Bouladon et al. | 451/37 |
| 4,549,374 | 10/1985 | Basi | 451/41 |
| 4,968,381 | 11/1990 | Prigge et al. | 156/636.1 |
| 5,069,002 | 12/1991 | Sandhu et al. | 451/1 |
| 5,136,819 | 8/1992 | Takagi et al. | 451/57 |
| 5,222,329 | 6/1993 | Yu | 451/11 |
| 5,265,378 | 11/1993 | Rostoker | 451/9 |
| 5,540,810 | 7/1996 | Sandhu et al. | 216/95 |

Primary Examiner—Robert A. Rose
Assistant Examiner—George Nguyen
Attorney, Agent, or Firm—Heslin & Rothenberg, P.C.

[57] ABSTRACT

An improved Chemical Mechanical Planarization (CMP) method is provided for selectively removing a layer of metallization material such as tungsten or copper and a liner film such as Ti/TiN or Ta/TaN from the surface of an oxide layer of a semiconductor wafer. The method includes removing the metallization and liner layers with a first removal process which utilizes CMP polishing and an alumina-based slurry. The first removal process is stopped after the metallization layer is completely removed and before the liner film is completely removed. The remainder of the liner film is removed using a second removal process which includes CMP polishing using a neutral pH silica-based slurry which is selective to the liner film.

5 Claims, 3 Drawing Sheets

SELECTIVE POLISH PROCESS FOR TITANIUM, TITANIUM NITRIDE, TANTALUM AND TANTALUM NITRIDE

TECHNICAL FIELD

This invention relates generally to the planarization of integrated circuit surfaces. More particularly, it relates to a chemical mechanical polishing process which reduces inadvertent generation of surface defects in underlying layers during planarization.

BACKGROUND ART

Integrated circuits are chemically and physically integrated into a substrate, such as a silicon or gallium arsenide wafer, by patterning layers on the substrate. These layers can be conductive, for conductor and resistor fabrication. They can also be of different conductivity types, which is essential for transistor and diode fabrication. Up to a thousand or more devices are formed simultaneously on the surface of a single wafer of semiconductor material.

It is essential for high device yields to start with a flat semiconductor wafer. If the process steps of device fabrication are performed on a wafer surface that is not uniform, various problems can occur which may result in a large device failure rate. Moreover, because any irregularities may be magnified as layers are deposited on the substrate, it is important for the layers and the substrate to be as planer as possible.

Semiconductor fabrication generally comprises providing tungsten or copper wiring or metallization in discrete layers of dielectric oxide film. Oxides typically used to form these film layers include phosphosilicate glass (PSG), borophosphosilicate glass (BPSG) or silicon dioxide ($SiO_2$). The oxide layer is then planarized using conventional planarization techniques. Thereafter, the oxide layer is etched or otherwise processed to pattern a series of trenches and holes therein. A thin liner film, generally not more than approximately 1,000 Angstroms thick is then deposited over the oxide layer. The liner generally comprises thin films of titanium (Ti) and titanium nitride (TiN) disposed over one another to form a Ti/TiN stack, or tantalum (Ta) and tantalum nitride (TaN) to form a Ta/TaN stack. Such a liner is commonly deposited by physical vapor deposition (PVD), otherwise known as sputter deposition, or it may be deposited by a chemical vapor deposition (CVD) to form a more conformed coating. Accordingly, the liner serves to coat the surfaces of the trenches and holes as well as the upper surface of the oxide layer and is used to provide good adhesion between the metallization layer and the oxide layer. The metallization is then provided by depositing a layer of tungsten (W) or copper (Cu), in the range of approximately 3,000–11,000 Angstroms thick, over the liner layer, wherein the W or Cu will completely fill the trenches and holes. The filled trenches thus form lines, damascene, or a "global wiring layer" while the filled holes comprise studs or vias, also known as "local interconnects". Fabrication of the wiring layer is then completed by removing the liner film and the tungsten or copper layer from the surface of the oxide film. This is typically accomplished by the use of Chemical Mechanical Planarization or CMP. The CMP process involves holding the semiconductor material against a rotating polishing pad surface under a controlled downward pressure. A polishing slurry such as a mixture of either a basic or acidic solution used as a chemical etch component in combination with alumina particles used as an abrasive etch component may be used. A rotating polishing head or wafer carrier is typically used to hold the semiconductor wafer under controlled pressure against a rotating polishing platen. The CMP process effectively removes the tungsten layer, however removal of the liner film has proven to be problematic. The liner is difficult to remove, tending to remain behind in localized topography caused by prior level damascene dishing/erosion, and in unplanarized features or defects such as scratches. In addition, while attempting to remove the remnants of this liner film, the relatively abrasive alumina based slurry used in the CMP process tends to damage the oxide layer by scratching and pitting the surface thereof. It is thus common practice to continue the CMP process until substantially all of the liner has been removed from the surface of the oxide, and then employ a second step commonly known as an "oxide touch up." This second step attempts to remove any residual liner material and replanarize the surface of the oxide to remove the scratches and other defects therein created by the CMP process. This oxide touch up step typically removes between 10 and 100 nanometers (nm), or between 100 and 1000 Angstroms (Å) of oxide.

This two-step approach, however, is not without significant drawbacks. In particular, the oxide touch up step is not always effective in removing the residual titanium and thus can cause additional erosion of the oxide layer, particularly in high pattern factor areas, or areas having a high density of metallization. In addition, the alumina-based slurry typically used in the CMP process is acidic whereas the oxide touch up chemical system is generally basic, wherein interaction between the two chemical systems can generate precipitates which complicate cleaning the slurry from the wafers. Moreover, the redundancy of planarizing the oxide surface a second time adds expense to the fabrication process while providing an opportunity for the introduction of further defects to the oxide surface.

Thus, a need remains for an improved method of removing the tungsten or copper layer and a Ti/TiN or Ta/TaN liner film from the surface of an oxide layer which does not require an oxide touch-up step to essentially replanarize the surface of the oxide.

SUMMARY OF THE INVENTION

According to an embodiment of this invention, a method of selectively removing a first film without removing an underlying film comprises the steps of removing the first film with a first removal process and stopping the removal process before the first film is completely removed. The remaining first film is removed using a second removal process that is selective to the first film.

Advantageously, this method substantially eliminates damage to the underlying film conventionally caused by CMP processing and thus eliminates the need for subsequent "touching up" or replanarization of the underlying film.

The above and other objects and advantages of this invention will be more readily apparent from a reading of the following description of an exemplary embodiment thereof taken in conjunction with the following drawing.

BEST MODE FOR CARRYING OUT THE INVENTION

Figure 1:
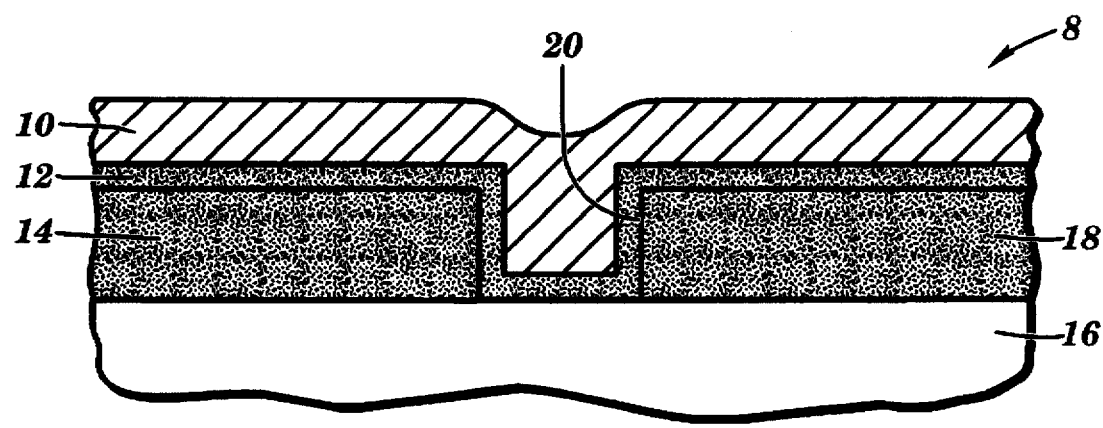
FIG. 1 is a schematic cross-sectional view of a semiconductor substrate with a trench etched therein, with a liner film and metallization layer disposed thereover.

Briefly described, the subject invention comprises a two-step CMP process for removing a tungsten (W) or copper (Cu) layer 10 and an underlying Ti/TiN or Ta/TaN liner 12 from the surface of an oxide layer 14, without damaging the oxide layer (FIG. 1). In a preferred embodiment, this is accomplished by a first step in which an alumina based slurry is used in a conventional CMP process to remove the W or Cu as well as an upper portion of the liner film. This first step is terminated while a substantial portion of the liner film remains on oxide layer 14. A second step involves utilizing a neutral pH silica-based slurry which is selective to Ti/TiN and Ta/TaN to remove the remainder of the liner film. By stopping the first step well before the polishing platen of the CMP apparatus has reached the oxide layer, the relatively abrasive alumina-based slurry is prevented from damaging the surface thereof, while the second step selectively removes the liner film without damaging the underlying oxide layer 14.

Referring now to FIG. 1, the subject invention is practiced on a semiconductor 8 which has previously undergone several conventional steps in the fabrication process. In particular, as discussed hereinabove, semiconductor substrate or wafer 16 has been overlaid with an oxide layer 18 such as PSG or BPSG. A trench 20 has been formed therein, followed by chemical vapor deposition (CVD) or similar conformal coating of a liner film 12 such as Ti/TiN or Ta/TaN, thereover, as also discussed hereinabove. A metallization material 10 such as W or Cu was then deposited over liner 12 in a thickness sufficient to completely fill trench 20.

Although the subject invention is equally applicable to global wiring layers and local interconnects fabricated from copper as well as tungsten and to liners of tantalum and tantalum nitride as well as titanium and titanium nitride, for the sake of simplicity, the invention will be described hereinafter in terms of a Ti/TiN liner and tungsten (W) metallization material.

Figure 2:
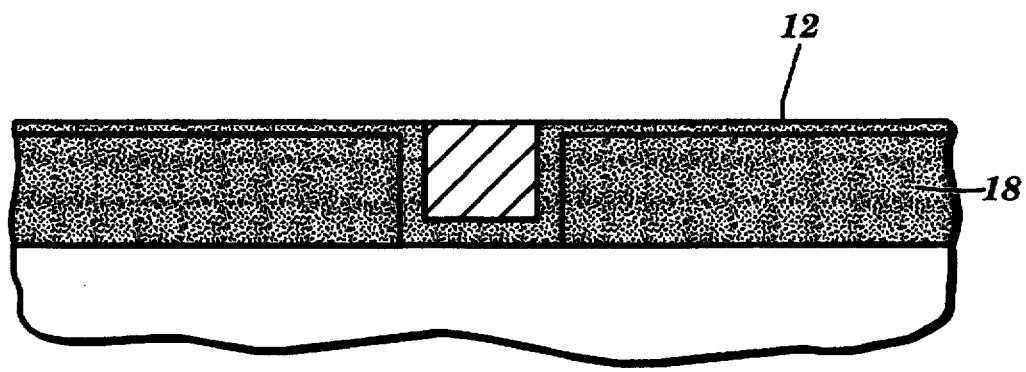
FIG. 2 is a view similar to that of FIG. 1, after completion of a first step of the subject invention.

The first step of the subject invention is to remove tungsten 10 using a standard CMP polishing process which utilizes a standard alumina-based slurry. Pursuant to this invention, however, as shown in FIG. 2, the polishing step is stopped after the polishing platen has reached the Ti/TiN film 12 but before it reaches oxide layer 18. Such stopping can be accomplished by setting the polish time based on the estimated thickness of tungsten 10 or by using a commonly available endpoint monitoring system as will be discussed hereinafter. The stopping point of this step may occur at any point within the thickness of the liner film to thereby simplify process control and minimize complexity and expense of implementing the subject invention, as will also be discussed in greater detail hereinafter.

Figure 3:
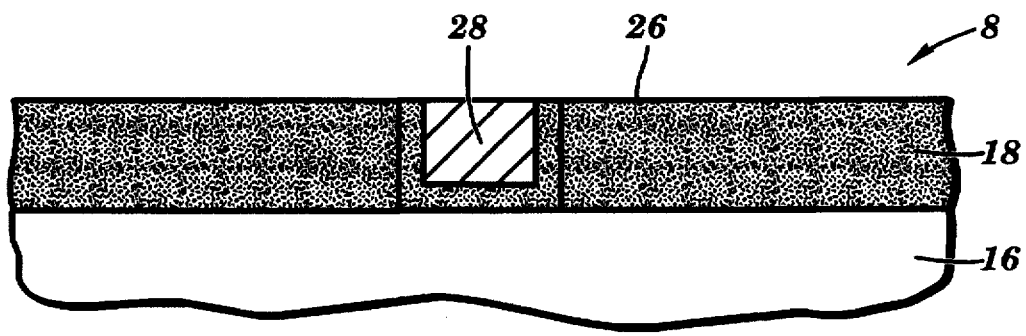
FIG. 3 is a view similar to that of FIGS. 1 and 2 after a second step of the subject invention.
Figure 4:
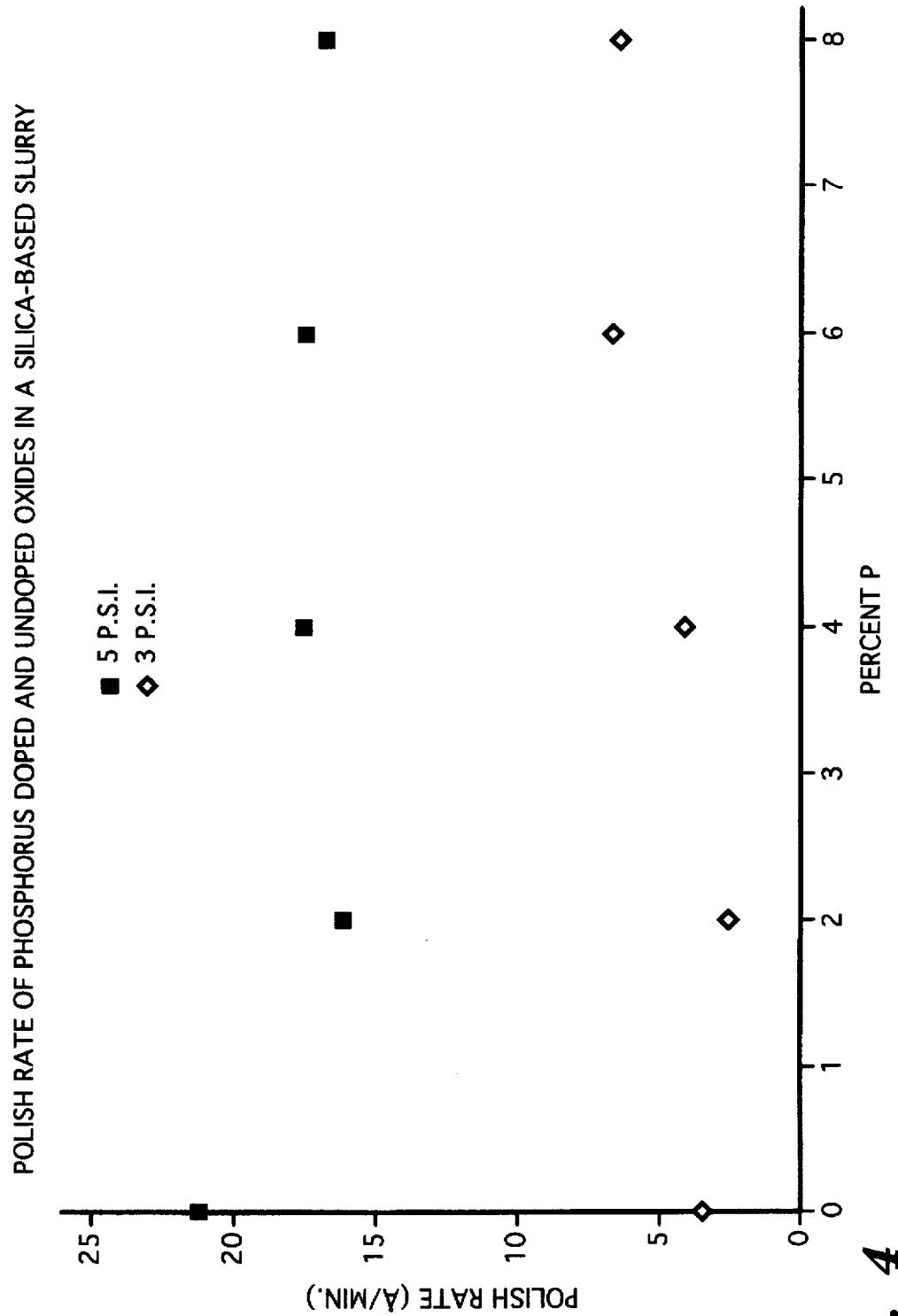
FIG. 4 is a chart indicating polish rates of oxides using a silica-based slurry of the type used to implement the subject invention.
Figure 5:
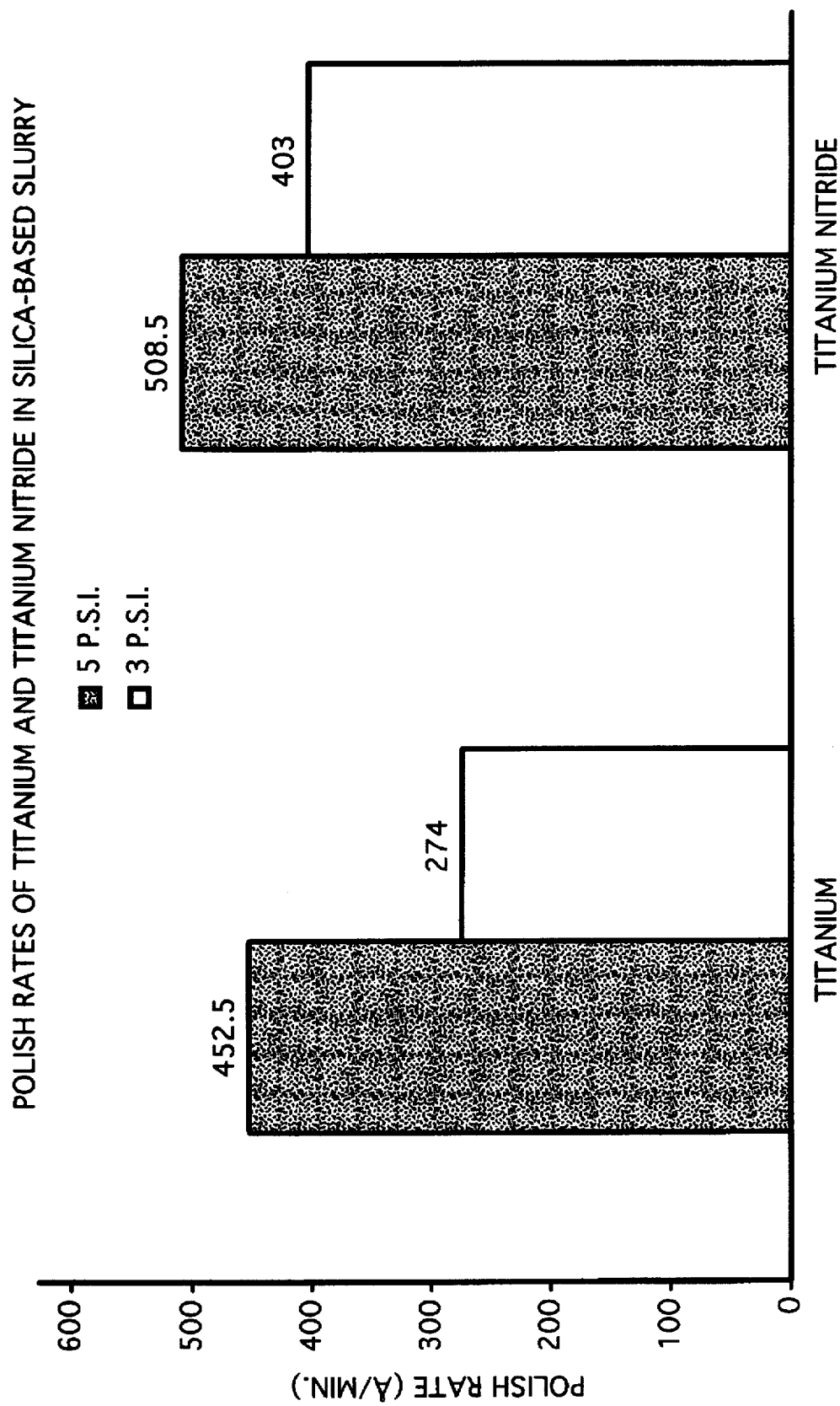
FIG. 5 is a chart indicating polish rates of titanium and titanium nitride using a silica-based slurry of the type used to implement the subject invention.

The second step of the subject invention includes using a silica and water or silica-based solution to polish wafer 8 to remove the remainder of liner 12 from oxide 18 as shown in FIG. 3. The silica-based solution is selective to the liner materials, wherein during polishing, titanium is removed very efficiently without removing much tungsten or oxide 18. For example, as shown in FIGS. 4 and 5, the rate of removal of oxide under standard operating conditions is only approximately 5–25 Angstroms per minute (FIG. 4) versus approximately 275–500 Angstroms per minute of titanium and titanium nitride (FIG. 5). A preferred silica-based solution is sold under the trademark CAB-O-SPERSE SC-E, manufactured by Cabot Corporation of Tuscola, Ill. and includes approximately 10–25% silica by weight. Other preferred items or parameters for implementation of this step include a soft polish pad such as a Politex or GS pad available from Rodel, Inc., a downforce applied to the pad of 3–5 psi and a polish time of 30–90 seconds.

This second step therefore, effectively removes the remainder of liner 12 nominally without removing any oxide 18, or creating dishing or concavities in the surface of the metallization lines or vias 28 to provide a substantially planar upper surface 26 of wafer 8 as shown in FIG. 3. Such dishing of the lines or vias frequently occurs when attempting to remove the titanium liner 12 with the alumina-based slurry as discussed hereinabove.

The subject invention thus optimizes CMP polishing of wafer 8 by taking advantage of the relatively high polish rate provided by the alumna-based slurry, while ensuring that the majority of scratching caused by the alumina disposed therein will occur in the film 12 rather than in oxide 18. This effectively eliminates the need to "touch-up" or replanarize the surface of the oxide which had already been planarized in a previous processing step. Elimination of this redundancy may therefore reduce processing time to ultimately reduce overall processing costs. Moreover, this process may produce a superior final product by eliminating the replanarization step and concomitantly, any imperfection or non-planarities introduced to the oxide thereby. The subject invention has also been shown to produce semiconductors having approximately 10% to 30% fewer defects than the prior art process discussed hereinabove. For example, test results comparing the subject invention with the prior art process resulted in an average of 629 vs. 702 defects per lot, respectively, during fabrication of logic devices and 1186 vs. 1505 defects per lot, respectively, during fabrication of memory products.

An additional advantage of the process of the subject invention as mentioned hereinabove, is that a relatively large process window is available in which to stop the first step. In particular, the first step may be stopped when the platen is disposed anywhere within the liner 12 thereby simplifying control of the process. In other words, the first step may be stopped at any time after layer 10 has been removed and before the liner film has been substantially removed from the oxide surface. Accordingly, as mentioned hereinabove, the stopping point of the first step may be successfully determined merely by estimating the polishing time based on average thicknesses of the layer 10 & liner 12.

In an alternate embodiment, however, the subject invention may be used in combination with a conventional end point monitoring system such as model #2350 Planarization Endpoint Controller manufactured by Luxtron Corporation of Santa Clara, Calif. Such a system, by measuring the amount of electric current drawn by the drive motor of the CMP polisher, is capable of indicating when the platen has removed substantially all of tungsten layer 10 and has moved into surface to surface contact with liner film 12. Accordingly, use of such an end point monitoring system may further enhance control of the process of the subject invention to still further improve the chip yield achieved using the subject invention.

Although a preferred embodiment of the subject invention includes use of a slurry which is selective to a liner film of Ti/TiN or Ta/TaN, it should be recognized by one skilled in the art that any material may be utilized for the liner film, and any slurry may be used to practice the second step of the subject invention, as long as the slurry is selective to the liner film, to thereby remain within the scope of the invention.

The foregoing description is intended primarily for purposes of illustration. Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

Having thus described the invention, what is claimed is:

1. A method of selectively removing a liner film and a metallization material superimposed over the liner film, without removing an underlying oxide layer of a semiconductor wafer disposed beneath the liner film and metallization material, comprising the steps of:

removing the metallization material with a first removal process, said first removal process comprising CMP polishing using a first slurry;

determining when said first removal process has removed substantially all of the metallization material;

stopping the first removal process; and removing the liner film using a second removal process that is selective to the liner film, said second removal process comprising CMP polishing using a different slurry, said different slurry having a substantially neutral pH.

2. The method of claim 1 wherein said first slurry comprises an alumina based slurry, and said different slurry comprises a silica-based slurry.

3. The method of claim 2, wherein said liner film comprises one of Ti/TiN and Ta/TaN, and said metallization material comprises one of tungsten and copper.

4. The method of claim 3, wherein the silica-based slurry comprises between approximately 10–25% silica by weight.

5. The method of claim 4, wherein the underlying film is selected from the group consisting of PSG, BPSG and $SiO_2$.

* * * * *